(12) United States Patent
Traister (10) Patent No.: US 7,987,332 B2
(45) Date of Patent: Jul. 26, 2011

(54) METHODS FOR STORING MEMORY OPERATIONS IN A QUEUE

(75) Inventor: Shai Traister, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 492 days.

(21) Appl. No.: 11/726,648

(22) Filed: Mar. 21, 2007

(65) Prior Publication Data

US 2008/0235466 A1 Sep. 25, 2008

(51) Int. Cl.
*G06F 13/18* (2006.01)
(52) U.S. Cl. ........................................................ 711/167
(58) Field of Classification Search .................. 711/167
See application file for complete search history.

(56) References Cited

U.S. PATENT DOCUMENTS

| | | | |
|---|---|---|---|
| 5,912,848 A * | 6/1999 | Bothwell | 365/195 |
| 6,493,807 B1 * | 12/2002 | Martwick | 711/163 |
| 6,704,835 B1 * | 3/2004 | Garner | 711/103 |
| 6,779,045 B2 * | 8/2004 | Kendall et al. | 710/5 |
| 7,093,071 B2 | 8/2006 | Rudelic | |
| 7,437,499 B2 * | 10/2008 | Durante et al. | 711/103 |
| 7,441,071 B2 | 10/2008 | Traister et al. | |
| 7,444,461 B2 | 10/2008 | Traister et al. | |
| 7,444,462 B2 | 10/2008 | Traister et al. | |
| 7,451,265 B2 | 11/2008 | Traister et al. | |
| 2005/0073884 A1 * | 4/2005 | Gonzalez et al. | 365/185.02 |
| 2005/0091445 A1 | 4/2005 | Chang et al. | |
| 2006/0020745 A1 * | 1/2006 | Conley et al. | 711/103 |
| 2006/0136655 A1 * | 6/2006 | Gorobets et al. | 711/103 |
| 2006/0184718 A1 | 8/2006 | Sinclair et al. | |
| 2006/0184719 A1 * | 8/2006 | Sinclair | 711/103 |
| 2006/0184720 A1 | 8/2006 | Sinclair et al. | |
| 2006/0239080 A1 | 10/2006 | Li | |
| 2007/0033376 A1 | 2/2007 | Sinclair et al. | |
| 2008/0034174 A1 | 2/2008 | Traister et al. | |
| 2008/0034175 A1 | 2/2008 | Traister et al. | |
| 2008/0082728 A1 | 4/2008 | Traister et al. | |
| 2008/0086619 A1 | 4/2008 | Traister et al. | |
| 2008/0235480 A1 | 9/2008 | Traister | |

FOREIGN PATENT DOCUMENTS

| | | |
|---|---|---|
| WO | WO 2006/120679 | 11/2006 |
| WO | WO 2008/115720 | 9/2008 |

OTHER PUBLICATIONS

PCT International Search Report and Written Opinion of the International Searching Authority mailed Jul. 30, 2008 in Application No. PCT/US2008/056418.
U.S. Office Action mailed Sep. 1, 2009 in U.S. Appl. No. 11/726,646.
U.S. Final Office Action mailed Dec. 28, 2009 in U.S. Appl. No. 11/726,646.

\* cited by examiner

*Primary Examiner* — Duc T Doan
(74) *Attorney, Agent, or Firm* — Weaver Austin Villeneuve & Sampson LLP (57) ABSTRACT

A method for operating a non-volatile memory storage system is provided. In this method, a queue that is configured to store memory operations associated with two or more types of memory operations. Here, memory operations are associated with the maintenance of the non-volatile memory storage system. A memory operation is scheduled for execution in response to an event and the memory operation is stored in the queue.

34 Claims, 6 Drawing Sheets

METHODS FOR STORING MEMORY OPERATIONS IN A QUEUE

CROSS-REFERENCES TO RELATED APPLICATIONS

This application is related to U.S. patent application Ser. No. 11/726,646, filed on Mar. 21, 2007, and entitled "Systems for Storing Memory Operations in a Queue," the disclosure of which is incorporated herein by reference.

FIELD OF THE INVENTION

The present invention relates generally to memory operations and, more particularly, to methods and systems for storing memory operations in a queue.

BACKGROUND

Non-volatile memory storage systems may receive, transmit, or issue operations or instructions associated with the operations of a memory. Most memory operations received or issued by the non-volatile memory storage system are executed immediately. However, due to different timing limitations (e.g., initialization timeout, write command timeout limitations, and other timing limitations), there might not be enough time allocated to completely execute a memory operation. As a result, the execution of the memory operation may be deferred until the next available timeslot or ignored until the next time the memory operation is triggered.

Currently, the memory operations are temporarily stored in the random access memory (RAM) of the non-volatile memory storage system. However, the RAM is configured to store only one of each type of deferred memory operation. For example, if the non-volatile memory storage system needs to refresh a block and, as a result, triggers a garbage collection operation, the garbage collection operation can be stored in the RAM and deferred for execution at a later time. On the other hand, if the non-volatile memory storage system needs to refresh two blocks, both garbage collection operations associated with the refreshes are not stored in the RAM. Furthermore, once a power loss occurs, the information stored in the RAM is lost and the memory operation will not be executed until the next time such memory operation is triggered. Such loss of information can lead to access errors and reduce the reliability of the non-volatile memory storage system. As a result, continuing efforts are being made to improve the storage of memory operations in the non-volatile memory storage system.

SUMMARY

Various embodiments of the present invention provide methods and systems for storing memory operations in a queue. It should be appreciated that the embodiments can be implemented in numerous ways, including as a method, a circuit, a system, or a device. Several embodiments of the present invention are described below.

In an embodiment, a method for operating a non-volatile memory storage system is provided. In this method, a queue that is configured to store memory operations associated with two or more types of memory operations. Here, memory operations are associated with the maintenance of the non-volatile memory storage system. A memory operation is scheduled for execution in response to an event and the memory operation is stored in the queue.

Other embodiments and advantages of the invention are apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

A detailed description of one or more embodiments is provided below along with accompanying figures. The detailed description is provided in connection with such embodiments, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

The embodiments described herein provide methods and/or systems for storing memory operations in a queue. The queue is stored in the non-volatile memory storage system and, as will be explained in more detail below, the queue is configured to store memory operations. The memory operations may be read by the non-volatile memory storage system and scheduled for execution. In an embodiment, the non-volatile memory storage system also assigns priorities to the memory operations and stores the priorities in the same queue.

Figure 1:
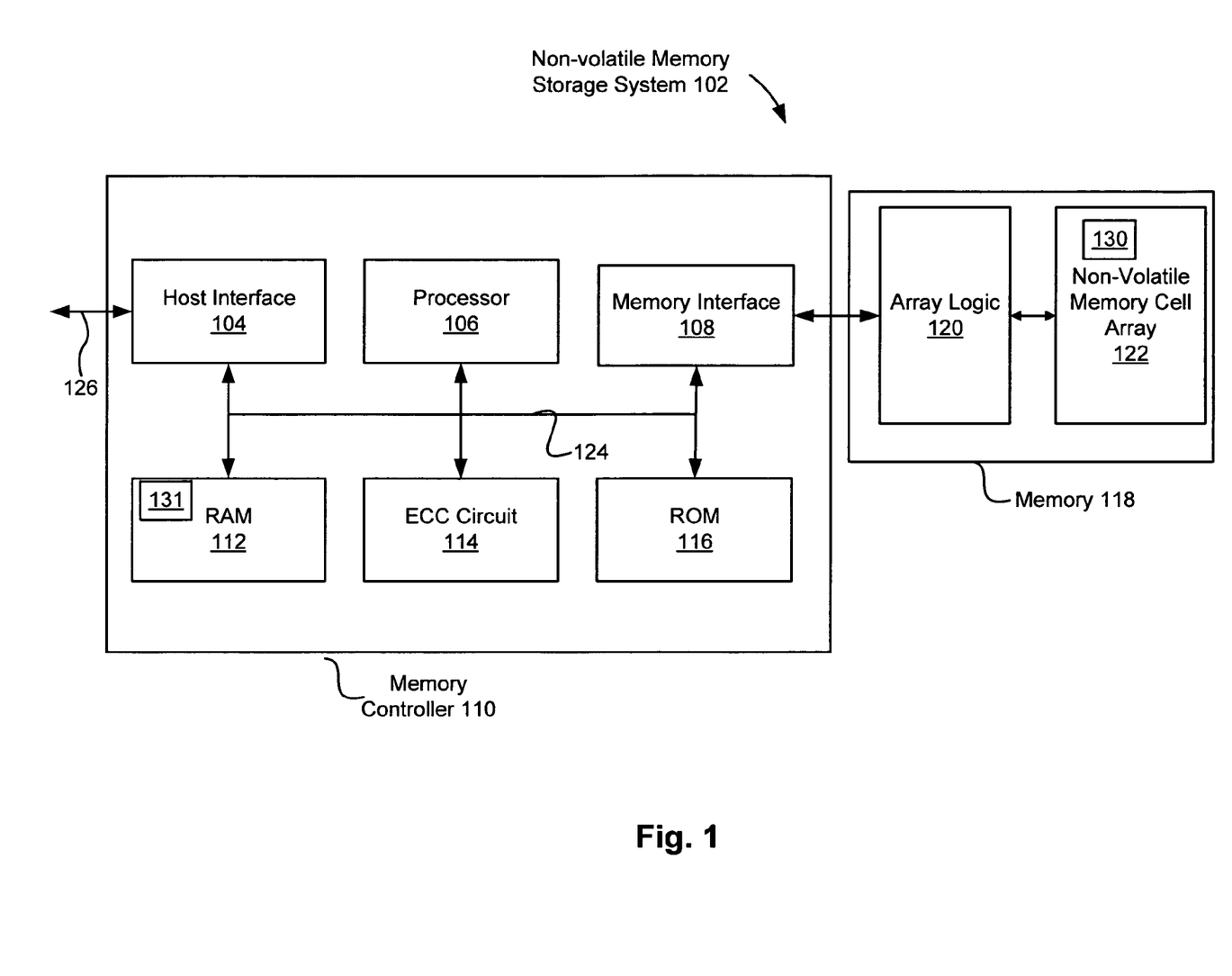
FIG. 1 is a simplified block diagram of an example of a non-volatile memory storage system, in accordance with an embodiment of the present invention.

FIG. 1 is a simplified block diagram of an example of a non-volatile memory storage system, in accordance with an embodiment of the present invention. A host system (e.g., desktop computers, audio players, digital cameras, and other computing devices) may write data to and read data from non-volatile memory storage system 102. Non-volatile memory storage system 102 may be embedded within the host or removably connected to the host. As shown in FIG. 1, non-volatile memory storage system 102 includes memory controller 110 in communication with memory 118. In general, memory controller 110 controls the operation of memory 118. Memory controller 110 includes bus 124 that interfaces with system bus 126 through host interface 104. Memory controller 110 further interfaces with memory 118 through memory interface 108. Host interface 104, processor 106 (e.g., microprocessor, microcontrollers, and other processors), memory interface 108, random access memory (RAM) 112, error correcting code (ECC) circuit 114, and read-only memory (ROM) 116 are in communication by way of bus 124. ROM 116 can store a storage system firmware that includes program instructions for controlling the operation of memory 118. Processor 106 is configured to execute the program instructions loaded from ROM 116 or from non-volatile memory cell array 122. The storage system firmware may be temporarily loaded into RAM 112 and additionally, the RAM may be used to buffer data that are transferred between a host and memory 118. Furthermore, RAM 112 may be configured to store queue 131 of memory operations. ECC circuit 114 can check for errors passing through memory controller 110 between the host and memory 118. If errors are found, ECC circuit 114 can correct a number of error bits, the number depending on the ECC algorithm utilized.

Memory 118 can include array logic 120 and non-volatile memory cell array 122. Non-volatile memory cell array 122 may include a variety or a combination of non-volatile memory structures and technologies. Examples of non-volatile memory technologies include flash memories (e.g., NAND, NOR, Single-Level Cell (SLC/BIN), Multi-Level Cell (MLC), Divided bit-line NOR (DINOR), AND, high capacitive coupling ratio (HiCR), asymmetrical contactless transistor (ACT), and other flash memories), erasable programmable read-only memory (EPROM), electrically-erasable programmable read-only memory (EEPROM), read-only memory (ROM), one-time programmable memory (OTP), and other memory technologies. In addition to RAM 112, queue 130 of memory operations may also be stored in non-volatile memory cell array 122.

Furthermore, array logic 120 interfaces memory controller 110 with non-volatile memory cell array 122 and can provide, for example, addressing, data transfer and sensing, and other support to the non-volatile memory cell array. To support non-volatile memory cell array 122, array logic 120 can include row decoders, column decoders, charge pumps, word line voltage generators, page buffers, input/output buffers, address buffers, and other circuitries.

Figure 2:
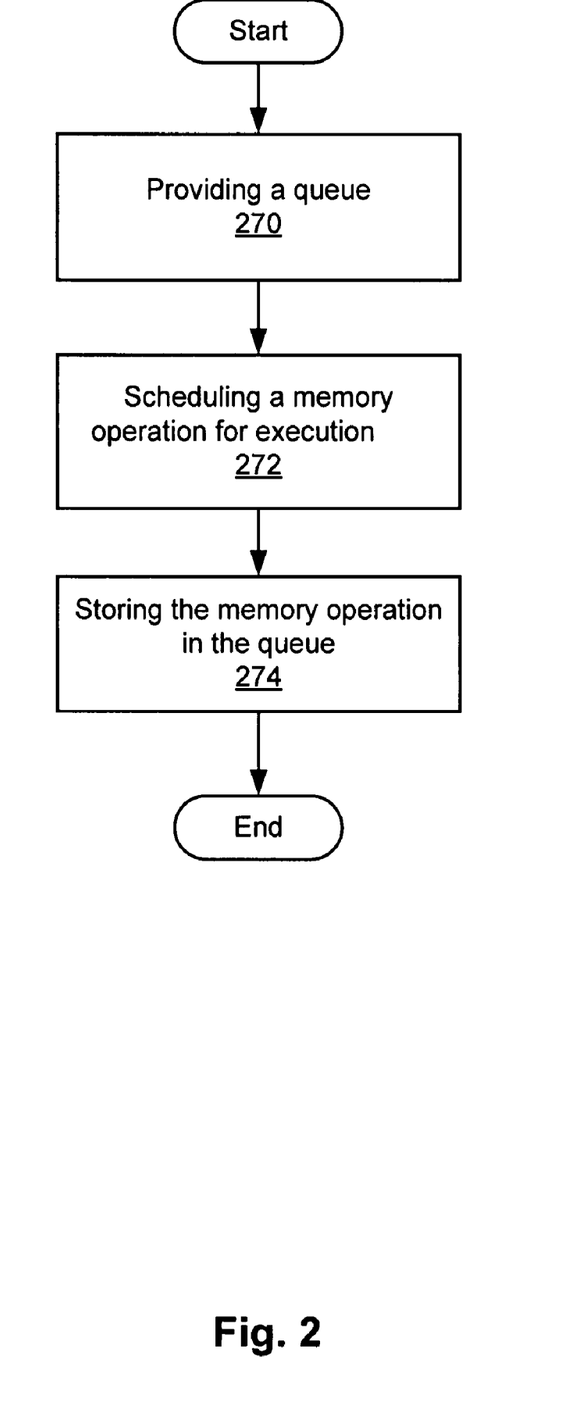
FIG. 2 is a flowchart diagram of a general overview of operations for storing memory operations in a queue, in accordance with an embodiment of the present invention.

FIG. 2 is a flowchart diagram of a general overview of operations for storing memory operations in a queue, in accordance with an embodiment of the present invention. Starting at 270, a queue is provided in the non-volatile memory storage system. The queue can include a variety of data structures that are configured to store memory operations. Examples of data structures include tables, arrays, and other data structures. Here, in an embodiment, the queue may store multiple memory operations associated with one or more types of memory operations. In another embodiment, the queue may store memory operations associated with two or more types of memory operations. For example, the queue may store two garbage collection operations (a garbage collection operation is one type or a single type of memory operation) that are operated on two, different blocks. Additionally, the queue may store five read scrubbing operations (a read scrubbing operation is one type or a single type of memory operation) that are operated on five, different blocks. The queue may be stored in a variety of memories within the non-volatile memory storage system. In an embodiment, the queue is stored in a non-volatile memory cell array within the non-volatile memory storage system. In another embodiment, the queue is stored in a random access memory within the non-volatile memory storage system. In yet another embodiment, the queue is stored in both the random access memory and the non-volatile memory cell array within the non-volatile memory storage system.

A memory operation is an instruction that instructs the non-volatile memory storage system to perform a task. In an embodiment, the memory operation can be associated with the maintenance of the non-volatile memory storage system. Such memory operations may be referred to as house keeping operations. House keeping operations include memory operations that are not transmitted to or requested by a host. Therefore, for example, house keeping operations can include all memory operations with the exception of an erase operation, a write operation, and a read operation that are requested or instigated by a host. Examples of house keeping operations include garbage collection, wear leveling, read scrubbing, write buffer block cleaning, write buffer block compaction, program error recovery, write abort recovery, and other memory operations. It should be noted that in a garbage collection operation, valid data from a block are copied to another block. After the valid data are transferred, the original block is erased to provide storage capacity. Blocks of data stored in the memory are periodically garbage collected (i.e., compacted or consolidated) to reclaim a memory's storage capacity. In wear leveling, logical data stored in non-volatile memory cell array are relocated periodically such that the data migrate throughout the entire physical space of the non-volatile memory cell array and all the blocks are worn evenly. It should also be appreciated that as the non-volatile memory storage system is used, the threshold level of a memory cell may lose margin, thereby producing a soft error not readily detectable. The non-volatile memory cell array may be continually scrubbed to maintain the memory cells within their proper margins. In a read scrubbing operation, the memory cells are tested to determine if their margins are maintained, and if not, the memory cells are rewritten with the proper margins. In write buffer block cleaning, the data stored in a write buffer block are copied to another block. In write buffer block compaction, the valid data stored in the write buffer block are compacted. It should also be appreciated that a write operation may fail when writing data to an area of the non-volatile memory cell array (e.g., a block). In program error recovery, valid data stored in this area before the failed write operation are copied to another location. Similarly, if a power loss occurs during a write operation to an area of the non-volatile memory cell array, then valid data written before the power loss are copied to another location in a write abort recovery.

At 272, a memory operation is scheduled for execution in response to an event. An event in the non-volatile memory storage system can trigger a memory operation. An event can be the detection of a state, a meeting of a condition, or a meeting of a criterion within the non-volatile memory storage system. Alternatively, an event can be the receipt of a command to perform a memory operation. Examples of events include receiving data from host which triggers the closure of an update block, detecting a programming failure in an update block, detecting write abort condition which triggers a write abort recovery in a block, meeting criteria for refreshing file system blocks, meeting criteria for wear leveling on a block, meeting criteria (e.g., amount of space left in control blocks) which triggers compaction of control blocks (e.g., write buffer block, map block, index block, write buffer block index block, and other control blocks), and other events. Depending on the event that triggered the memory operation and the state of the non-volatile memory storage system, the memory operation may be scheduled for execution immediately or scheduled for execution at a later time. For example, if the non-volatile memory storage system is currently writing data, then the non-volatile memory storage system may schedule the triggered memory operation for execution after the data are written. In another example, if the non-volatile memory storage system is not busy, then the memory operation received may be scheduled for immediate execution.

At the same time the memory operation is scheduled for execution, the memory operation is stored in the queue at 274. The queue can be stored in a variety of memory areas within the non-volatile memory storage system. For example, as will be explained in more detail below, the queue can be stored across one or more sectors, pages, or blocks. If the queue is stored in the non-volatile memory cell array, the memory operations stored in the queue will not be lost in the event that the non-volatile memory storage system is initialized. When the non-volatile memory storage system is initialized, the non-volatile memory storage system is set to an initial state. Initialization of the non-volatile memory storage system can occur in the event of a power cycle, when the non-volatile memory storage system is disconnected from and then reconnected to a host, or when the non-volatile memory storage system receives a reset command from the host.

Figure 3:
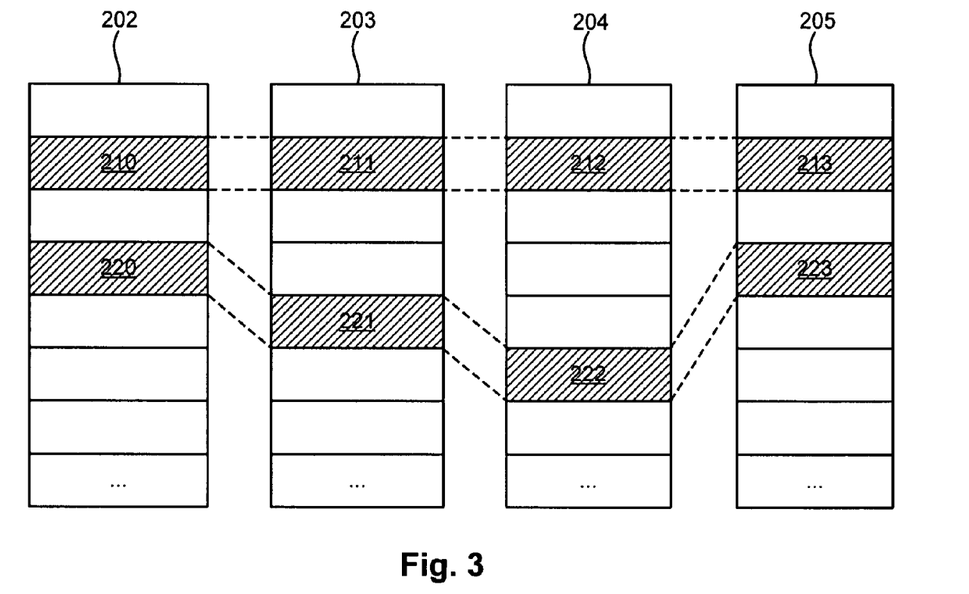
FIG. 3 is a simplified block diagram of an organization of the memory cell array into planes.

FIG. 3 is a simplified block diagram of an organization of the memory cell array into planes. As discussed above, the queue can be stored in a variety of memory areas within the non-volatile memory storage system. It should be noted that one or more memory cell arrays may be divided into multiple planes or sub-arrays. In the example of FIG. 3, a memory cell array is divided into four planes 202-205. Other number of planes, such as 1, 2, 4, 8, 16, or more, can exist in a non-volatile memory storage system. Each plane 202, 203, 204, or 205 may be divided into blocks of memory cells, such as blocks 210-213 and 220-223, located in respective planes 202-205. A block of memory cells is the smallest number of memory cells that are physically erasable together. For increased parallelism, the blocks can be operated in larger metablock units where one block from each plane 202, 203, 204, or 205 is logically linked together to form a metablock. For example, four blocks 210-213 can be logically linked together to form a metablock. Further, the blocks used to form a metablock can be from various locations within their respective planes, such as planes 202-205. For example, four blocks 220-223 from various locations within their respective planes 202-205 can be logically linked together to form another metablock. A metablock may extend across all four logical planes 202-205 within the non-volatile memory storage system or the non-volatile memory storage system can dynamically form metablocks from one or more blocks in one or more different planes.

In an embodiment, the queue is stored in one or more blocks. For example, the queue may be stored in a control block, such as a write buffer block. The write buffer block is maintained in the non-volatile memory cell array. In general, the write buffer block buffers received data in the non-volatile memory storage system. The write buffer block serves as a temporary buffer, as data written to the write buffer block are later copied to another block. The write buffer block can span multiple logical addresses. For instance, the write buffer block can span an entire logical address space. By spanning the entire logical address space, the write buffer block can store data that are about to be written to all logical addresses and all groups of logical addresses (i.e., all logical groups) throughout the non-volatile memory storage system. In other words, data associated with different logical groups can be stored in the write buffer block. It should be noted that a logical group is a group of logical addresses with a size that may equal to the size of a metablock. A second example of a control block is an index block. In general, the index block stores indexing information for accessing various blocks within the non-volatile memory storage system. Indexing information may, for example, include information about the location of valid copies of various types of blocks. A third example of a control block is a map block. The map block stores a map of blocks in the non-volatile memory storage system and information that indicates whether each block is erased. For instance, the map block can store a list of addresses of erased blocks. A fourth example of a control block is a boot block. The boot block stores the current address of the map block. In other words, the boot block stores a pointer to the map block. Thus, when the map block is relocated, the current address of the map block stored in the boot block is updated. The boot block may be located in the first usable metablock. A fifth example of a control block is a scratch pad block. It should be appreciated that a scratch pad block is a form of data update block in which logical sectors may be updated in a random order and with any amount of repetition. The scratch pad block is created by a write command where the intended logical sectors do not end or cross a physical page boundary. Since the non-volatile memory storage system may not be able to program partial pages, sectors of a page can be temporarily stored in the scratch pad block. The non-volatile memory storage system accumulates sectors of the page in the scratch pad block until all the sectors of the page are filled with new data from various write commands. The non-volatile memory storage system then copies the full page (e.g., eight sectors of new data) from the scratch pad block to another block, such as an update block, in one program operation.

Figure 4:
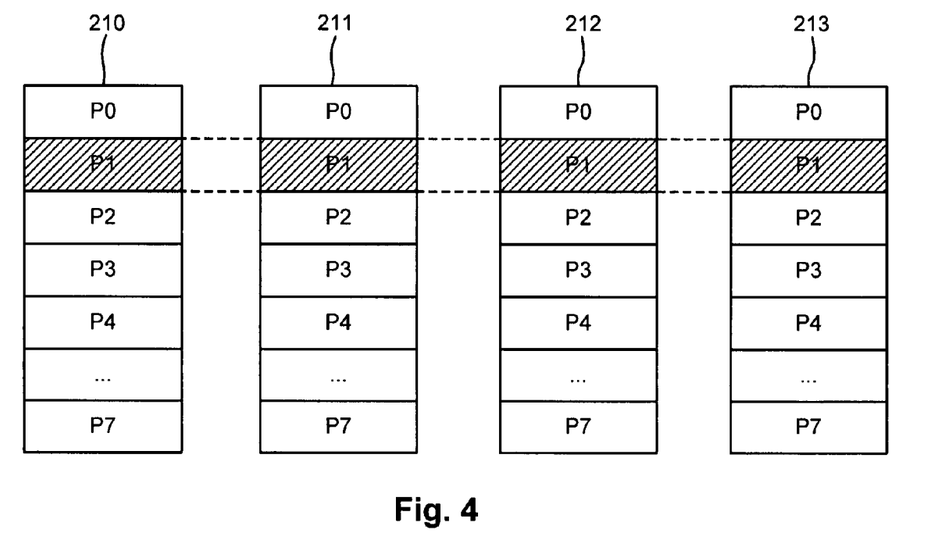
FIG. 4 is a simplified block diagram of pages of memory cells.

FIG. 4 is a simplified block diagram of pages of memory cells. Each block, such as blocks 210-213, can be further divided into pages of memory cells. As a result, the queue can cover one or more pages of memory cells. As shown in FIG. 4, each block 210, 211, 212, or 213 is divided into eight pages P0-P7. Alternatively, there can be 16, 32, or more pages of memory cells within each block 210, 211, 212, or 213. To increase the operational parallelism of the non-volatile memory storage system, the pages within two or more blocks may be logically linked into metapages. For example, a metapage can be formed of one page, such as P1, from each of four blocks 210-213. A metapage can extend across all planes within the non-volatile memory storage system or the non-volatile memory storage system can dynamically form metapages from one or more pages in one or more separate blocks in one or more different planes.

Figure 5:
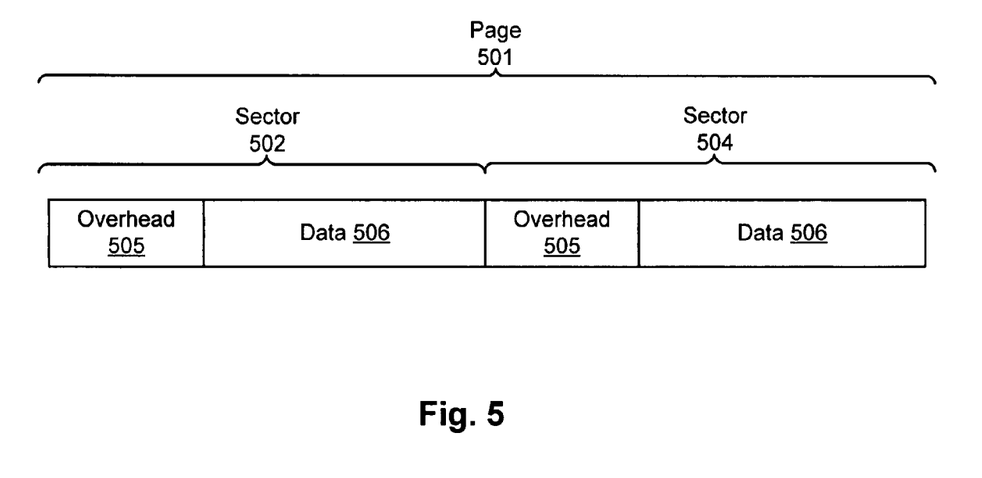
FIG. 5 is a simplified block diagram of sectors of memory cells.

FIG. 5 is a simplified block diagram of sectors of memory cells. A page can be further divided into one or more sectors. As a result, the queue can cover one or more sectors of memory cells. The amount of data in each page can be an integer number of one or more sectors of data, where each sector may store 512 bytes of data. FIG. 5 shows page 501 divided into two sectors 502 and 504. Each sector 502 or 504 contains data 506, which can be 512 bytes in size, and overhead data 505 associated with the data. The size of overhead data 505 can be 16 bytes and can store, for example, ECC calculated from data 506 during programming, the logical address associated with the data, a count of the number of times the block has been erased and re-programmed, control flags, operating voltage levels, and other information associated with the data.

Figure 6:
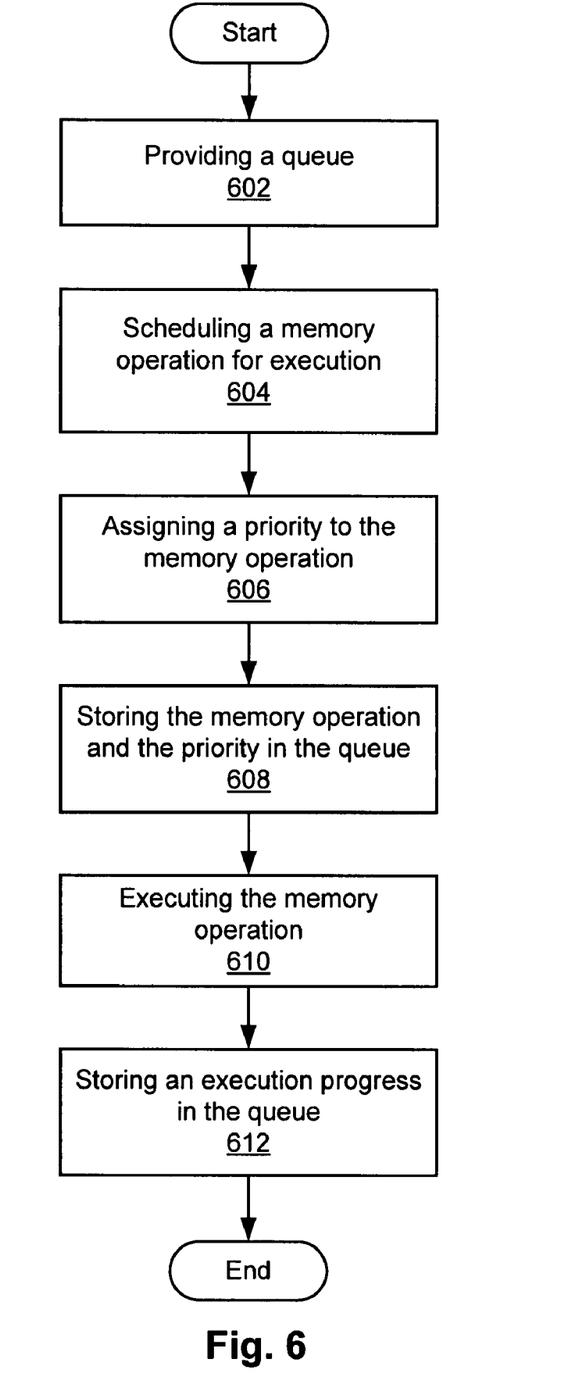
FIG. 6 is a flowchart diagram of a general overview of operations for storing memory operations and priorities associated with the memory operations in a queue, in accordance with an embodiment of the present invention.

FIG. 6 is a flowchart diagram of a general overview of operations for storing memory operations and priorities associated with the memory operations in a queue, in accordance with an embodiment of the present invention. Starting at 602, a queue is provided and the queue is configured to store memory operations and priorities associated with the memory operations. In response to an event, a memory operation is scheduled for execution at 604 and a priority is assigned to the memory operation at 606. By assigning a priority to each memory operation, certain memory operations can be scheduled for execution before other memory operations. Different memory operations can be assigned different priorities. For example, the priorities can be a two-level high or low priority. In another example, the priorities can include multiple levels as shown in the following Table A.

TABLE A

| Priority | Description |
|---|---|
| "00" | Abort/discard current garbage collection and start execution of the memory operation immediately. |
| "01" | After completing current memory operation or already-started garbage collection, execute memory operation at the next available opportunity before clean-up of additional data from write buffer block. |
| "02" | After completing all scheduled memory operations with priority "01," execute memory operation before clean-up of additional data from write buffer block. Schedule memory operations in the foreground (either during write operation, read operation, or erase operation) or in the background operation (during host idle period) |
| "03" | Clean-up of write buffer block entries. |
| "04" | Execute memory operation after clean-up of all data from write buffer block. Schedule the memory operation for execution during read operations, write operations, erase operations, or background operations. |
| "05" | Execute memory operation after executing all scheduled memory operations with priority "04." Schedule the memory operation for execution during write operations, erase operations, or background operations. |
| "06" | Execute memory operation after executing all scheduled memory operations with priority "05" in background operation only. |

It should be noted that in Table A, a memory operation with a low priority number (e.g., "00") will be scheduled for execution before a memory operation with a high priority number (e.g., "06").

The priority may be predetermined or calculated based on one or more parameters. For example, if the non-volatile memory storage system can correct eight bits of error-correcting code (ECC) and there are seven bits of error, then a high priority can be assigned to a memory operation that corrects the error. However, if there are four bits of error, then a low priority can be assigned to a memory operation that corrects the error. In an embodiment, a priority may be assigned to the memory operation based on the type of memory operation (e.g., wear leveling, read scrubbing, garbage collection, and other types of memory operations). In other words, the priority can be expressed as Priority=$f$(type of memory operation)

where the priority is a function of the type of memory operation. For example, a wear leveling memory operation can be assigned or designated as a low priority. In another embodiment, the priority may be assigned to the memory operation based on the type of event that triggered the memory operation. In other words, the priority can be expressed as Priority=$f$(type of event)

where the priority is a function of the type of event that triggered the memory operation. An example can include assigning a medium priority to a memory operation that is triggered by a failure in an update block. On the other hand, a memory operation that is triggered by a write abort recovery can be assigned a high priority. In still another embodiment, the priority may be based on a combination of the type of memory operation and the type of event that triggered the memory operation. In other words, the priority can be expressed as Priority=$f$(type of memory operation, type of event)

where the priority is a function of the type of memory operation and the type of event that triggered the memory operation.

After the priority is assigned to the memory operation, the memory operation and the priority are stored in the queue at 608. Here, the queue may include entries for the memory operations, the priorities associated with the memory operations, and other information associated with the memory operations, such as block number, sector location, page location, counter, specific sector within a block, and other information.

Still referring to FIG. 6, the memory operation then is executed at 610. It should be appreciated that the memory operation may not be completely executed because, for example, there is not enough time allocated to completely execute the memory operation. The execution of the memory operation therefore may be deferred. In an embodiment, as shown at 612, the execution progress can be stored in the queue. The execution progress indicates the amount of the memory operation that has been completed. The execution progress includes a variety of information relating to the advancement of execution of the memory operation. Such information can include a point, a state, or a phase of execution. For example, the number of blocks, pages, and/or sectors copied, various stages or phases of a memory operation if the execution can be phased into predefined stages (e.g., $1^{st}$, $2^{nd}$, or $3^{rd}$ stage of a firmware upgrade), and other information. With the execution progress stored in the queue, the memory operation can be partially executed. At a later time, the execution of the memory operation can be resumed until completed even if a power cycle occurs between execution of different phases of the memory operation.

Figure 7:
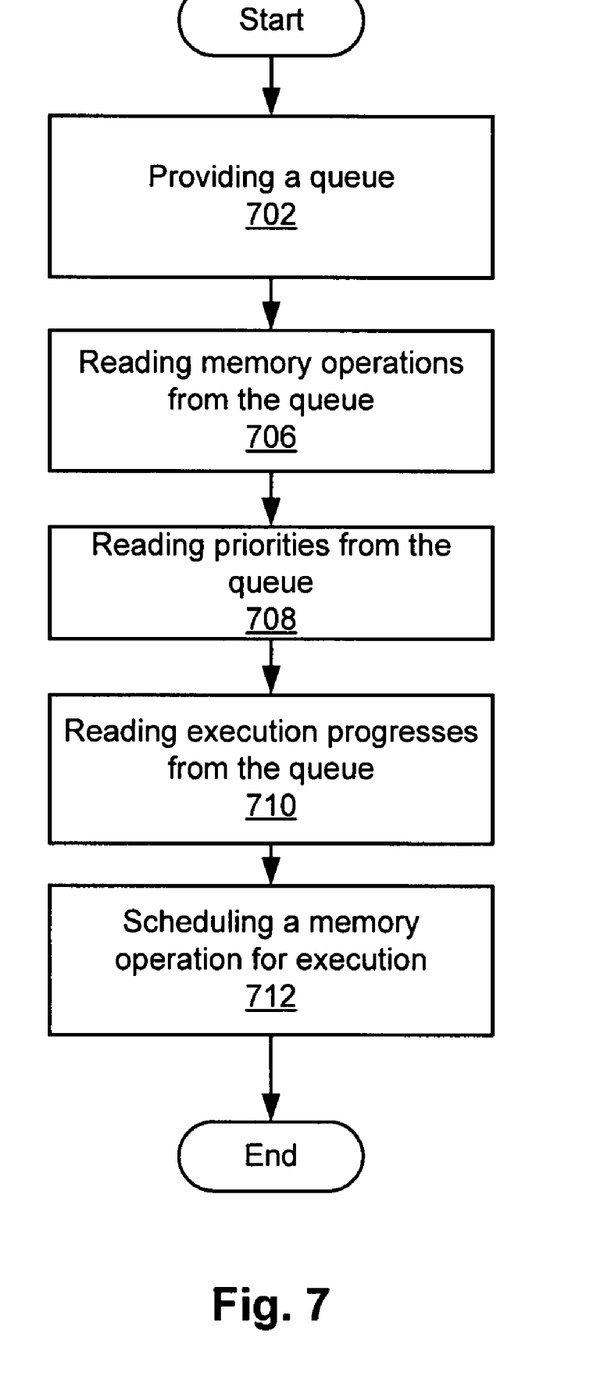
FIG. 7 is a flowchart diagram of a general overview of operations for reading memory operations from the queue, in accordance with an embodiment of the present invention.

FIG. 7 is a flowchart diagram of a general overview of operations for reading memory operations from the queue, in accordance with an embodiment of the present invention. Starting at 702, a queue is provided. As discussed above, memory operations that are scheduled to be executed and their associated priorities and/or execution progresses are stored in the queue. At 706, the memory operations are read from the queue. The non-volatile memory storage system may read from the queue when the non-volatile memory storage system is initialized. The non-volatile memory storage system may also read from the queue when the non-volatile memory system is not busy executing other memory operations. For example, the host allows a fixed amount of time (i.e., a timeout period) for the execution of a write operation. For instance, the Secure Digital protocol limits the amount of time to 250 milliseconds. The amount of time to execute the write operation can be less than the timeout period. This excess amount of time (i.e., the difference between the timeout period and the amount of time to execute the write operation) can be used by the non-volatile memory system to execute the memory operations stored in the queue.

In addition to the memory operations, the priorities associated with the memory operations are read from the queue at 708. The execution progresses associated with the memory operations also can be read from the queue at 710. A particular memory operation then is scheduled for execution at 712. In an embodiment, each memory operation can be scheduled for execution based on its priority. Depending on the execution progress, the execution of the memory operation may be a resumption of execution from an earlier time. For example, in an embodiment, the execution progress is configured to define a point of execution. The point of execution is where a previous execution of the memory operation ended. The memory operation may be executed from the point of execution. In other words, execution of the memory operation can be resumed from the point of execution. The memory operation may be partially executed or completely executed. If the memory operation is partially executed, then the execution progress is stored in the queue such that the execution of the memory operation can be resumed at a later time. However, if the memory operation has been completely executed, then the memory operation may be removed or deleted from the queue. The next memory operation from the queue can then be scheduled for execution according to the priority.

Although the foregoing embodiments have been described in some detail for purposes of clarity of understanding, the embodiments are not limited to the details provided. There are many alternative ways of implementing the embodiments. Accordingly, the disclosed embodiments are to be considered as illustrative and not restrictive, and the embodiments are not to be limited to the details given herein, but may be modified within the scope and equivalents of the appended claims. In the claims, elements and/or operations do not imply any particular order of operation, unless explicitly stated in the claims.

What is claimed is:

1. A method for operating a non-volatile memory storage system having a memory controller and a non-volatile memory cell array, comprising:
    storing a plurality of memory operations in a queue in the non-volatile memory array, wherein the memory operations comprise operations issued by the memory controller and associated with two or more types of operations associated with maintenance of the non-volatile memory storage system;
    scheduling the plurality of memory operations for execution in response to an event and based on assigning a priority to each memory operation, wherein the priority for at least one memory operation is a high priority if a number of error bits detected for an error detection code (ECC) is a first number and a low priority if the number of error bits is a second lower number; and
    executing the memory operations stored in the queue based on the scheduling of such operations and their assigned priorities.

2. The method of claim 1, further comprising reading the memory operations from the queue.

3. The method of claim 1, further comprising:
    storing the assigned priorities in the queue.

4. The method of claim 3, wherein at least one priority is assigned based on a type of the memory operation.

5. The method of claim 3, wherein at least one priority is assigned based on a type of the event.

6. The method of claim 1, further comprising:
    storing an execution progress in the queue.

7. The method of claim 6, further comprising:
    if a particular one of the memory operations is completely executed, deleting the completed particular memory operation from the queue; and
    if a particular one of the memory operations is partially executed, storing an execution progress in the queue for the partially completed particular operation.

8. The method of claim 1, wherein the queue is stored in a control block.

9. A method for operating a non-volatile memory storage system having a memory controller and a plurality of non-volatile memory cells, comprising:
    storing a plurality of memory operations in a queue in the non-volatile memory array, wherein the memory operations in the queue comprise memory operations issued by the memory controller and associated with two or more types of associated with maintenance of the non-volatile memory storage system;
    reading a particular one of the memory operations from the queue; and
    scheduling the particular memory operation for execution based on a plurality of assigned priorities for the memory operations stored in the queue, wherein the priority assigned to at least one memory operation is a high priority if a number of error bits detected for an error correction code (ECC) is a first number and a low priority if the number of error bits is a second lower number.

10. The method of claim 9, further comprising storing the assigned priorities in the queue.

11. The method of claim 10, further comprising reading a priority associated with the particular memory operation from the queue, wherein the particular memory operation is scheduled for execution based on the read priority.

12. The method of claim 9, further comprising storing in the queue a plurality of execution progresses associated with the plurality of memory operations.

13. The method of claim 12, further comprising:
    reading an execution progress associated with the particular memory operation from the queue, the execution progress being configured to define a point of execution; and
    executing the particular memory operation from the point of execution.

14. The method of claim 9, wherein the particular memory operation is read from the queue when the non-volatile memory storage system is initialized.

15. The method of claim 9, wherein the particular memory operation is read from the queue when the non-volatile memory storage system is not busy.

16. The method of claim 9, wherein the queue is stored in an index block.

17. The method of claim 9, wherein the queue is stored in a write buffer block.

18. The method of claim 9, wherein the queue is stored in a boot block.

19. The method of claim 9, wherein the queue is stored in a map block that indicates, for each block in the non-volatile memory storage system, whether the block is erased or not.

20. The method of claim 9, wherein the queue is stored in a scratch pad block created by a write command where the logical sectors of the write command do not end or cross a physical page boundary.

21. A method for operating a non-volatile memory storage system having a memory controller and a non-volatile memory cell array, comprising:

storing in a queue a plurality of house keeping operations issued by the memory controller and a plurality of priorities associated with the plurality of house keeping operations, the queue being stored in a scratch pad block of the non-volatile memory array;

scheduling a particular house keeping operation stored in the queue for execution in response to an event and based on the priorities associated with the house keeping operations, wherein the priority of at least one house keeping operation is a high priority if a number of error bits detected with error correction code (ECC) is a first number and a low priority if the number of error bits is a second lower number.

22. The method of claim 21, further comprising:

reading the particular house keeping operation and its associated priority from the queue; and     scheduling the particular house keeping operation for execution based on the read priority.

23. The method of claim 21, wherein at least one priority is assigned based on a type of the corresponding house keeping operation.

24. The method of claim 21, wherein at least one priority of the corresponding operation is assigned based on a type of the event.

25. A method for operating a non-volatile memory storage system having a memory controller and a non-volatile memory cell array, comprising:

storing in a queue a plurality of house keeping operations issued by the memory controller and a plurality of priorities associated with the plurality of house keeping operations, the queue being stored in a scratch pad block;

reading a particular house keeping operation and a priority associated with the particular house keeping operation from the queue; and     scheduling the particular house keeping operation for execution based on the priorities of the house keeping operations stored in the queue, wherein the priority assigned to at least one house keeping operation is a high priority if a number of error bits detected for an error correction code (ECC) is a first number and a low priority if the number of error bits is a second lower number.

26. A non-volatile memory storage system, comprising:
a memory controller; and
a non-volatile memory cell array the memory controller being configured to:
store a plurality of memory operations in a queue of the non-volatile memory array, wherein the memory operations comprise operations issued by the memory controller and associated with two or more types of operations associated with maintenance of the non-volatile memory storage system,
schedule the plurality of memory operations for execution in response to an event and based on assigning a priority to each memory operation in the queue, wherein the priority of at least one memory operation is a high priority if a number of error bits detected for an error detection code (ECC) is a first number and a low priority if the number of error bits is a second lower number.

27. The non-volatile memory storage system of claim 26, further comprising a random access memory in communication with the memory controller, the random access memory being configured to store the queue.

28. The non-volatile memory storage system of claim 26, wherein the memory controller is further configured to read the memory operations from the queue.

29. The non-volatile memory storage system of claim 26, wherein the memory controller is further configured to:
    assign the priority of each memory operation; and
    store the priority of each memory operation in the queue.

30. The non-volatile memory storage system of claim 29, wherein at least one priority is assigned based on a type of the corresponding memory operation.

31. The non-volatile memory storage system of claim 29, wherein at least one priority is assigned based on a type of corresponding event.

32. The non-volatile memory storage system of claim 26, wherein the memory controller is further configured to:
    execute the particular house keeping operation; and
    store an execution progress for the house keeping operation in the queue.

33. The non-volatile memory storage system of claim 32, wherein the memory controller is further configured to:
    delete the particular house keeping operation from the queue if the particular house keeping operation is completely executed; and
    store the execution progress in the queue if the particular house keeping operation is partially executed.

34. The non-volatile memory storage system of claim 26, wherein the queue is stored in a control block.

\* \* \* \* \*